(12) United States Patent
Saraswatula et al.

(10) Patent No.: US 11,035,666 B2
(45) Date of Patent: Jun. 15, 2021

(54) INSPECTION-GUIDED CRITICAL SITE SELECTION FOR CRITICAL DIMENSION MEASUREMENT

(71) Applicant: KLA-TENCOR CORPORATION, Milpitas, CA (US)

(72) Inventors: Jagdish Chandra Saraswatula, Puttaparthi (IN); Arpit Yati, Chennai (IN); Hari Pathangi, Chennai (IN)

(73) Assignee: KLA-Tencor Corporation, Milpitas, CA (US)

( * ) Notice: Subject to any disclaimer, the term of this patent is extended or adjusted under 35 U.S.C. 154(b) by 668 days.

(21) Appl. No.: 15/904,402

(22) Filed: Feb. 25, 2018

(65) Prior Publication Data
US 2019/0041202 A1 Feb. 7, 2019

Related U.S. Application Data

(60) Provisional application No. 62/559,820, filed on Sep. 18, 2017.

(30) Foreign Application Priority Data

Aug. 7, 2017 (IN) .............................. 201741027957

(51) Int. Cl.
*G01B 21/02* (2006.01)
*G06N 3/04* (2006.01)
(Continued)

(52) U.S. Cl.
CPC ............. *G01B 21/02* (2013.01); *G01B 21/20* (2013.01); *G01R 31/2846* (2013.01); *G06N 3/04* (2013.01);
(Continued)

(58) Field of Classification Search
CPC .... G01B 21/02; G01B 21/20; G01B 2210/56; G06N 3/04; G06N 3/08; H01L 22/20; H01L 22/12; G01R 31/2846; G01R 31/2894
See application file for complete search history.

(56) References Cited

U.S. PATENT DOCUMENTS 6,452,677 B1   9/2002  Do et al.
2007/0156379 A1*  7/2007  Kulkarni ................. G06F 30/30
                                                                  703/14
(Continued)

OTHER PUBLICATIONS

Gorelikov et al., Model-based CD-SEM metrology at low and ultralow landing energies: implementation and result for advanced IC manufacturing, Surface and Interface Analysis, 2005, vol. 37, pp. 959-965.
(Continued)

*Primary Examiner* — Alexander Satanovsky
*Assistant Examiner* — Mark I Crohn
(74) *Attorney, Agent, or Firm* — Hodgson Russ LLP

(57) ABSTRACT

Systems and methods for determining location of critical dimension (CD) measurement or inspection are disclosed. Real-time selection of locations to take critical dimension measurements based on potential impact of critical dimension variations at the locations can be performed. The design of a semiconductor device also can be used to predict locations that may be impacted by critical dimension variations. Based on an ordered location list, which can include ranking or criticality, critical dimension can be measured at selected locations. Results can be used to refine a critical dimension location prediction model.

16 Claims, 7 Drawing Sheets

(51) Int. Cl.
*G01B 21/20* (2006.01)
*H01L 21/66* (2006.01)
*G01R 31/28* (2006.01)
*G06N 3/08* (2006.01)

(52) U.S. Cl.
CPC ............... *G06N 3/08* (2013.01); *H01L 22/20* (2013.01); *G01B 2210/56* (2013.01); *H01L 22/12* (2013.01)

(56) References Cited

U.S. PATENT DOCUMENTS

| | | |
|---|---|---|
| 2009/0007030 A1 | 1/2009 | Nehmadi et al. |
| 2010/0046828 A1 | 2/2010 | Anilturk |
| 2014/0019927 A1 | 1/2014 | Yudhistira et al. |
| 2014/0301630 A1* | 10/2014 | Kulkarni ............... G06T 7/0004 382/149 |
| 2016/0341791 A1* | 11/2016 | Duffy ................... G01R 31/305 |

OTHER PUBLICATIONS

ISA/KR, ISR and WO for PCT/US2018/045303, Nov. 28, 2018.

* cited by examiner

INSPECTION-GUIDED CRITICAL SITE SELECTION FOR CRITICAL DIMENSION MEASUREMENT

CROSS-REFERENCE TO RELATED APPLICATIONS

This application claims priority to Indian Provisional Application No. 201741027957, filed on Aug. 7, 2017, and U.S. Provisional Application No. 62/559,820, filed on Sep. 18, 2017, the disclosures of which are hereby incorporated by reference.

FIELD OF THE DISCLOSURE

This disclosure relates to semiconductor inspection.

BACKGROUND OF THE DISCLOSURE

Evolution of the semiconductor manufacturing industry is placing ever greater demands on yield management and, in particular, on metrology and inspection systems. Critical dimensions (CDs) are shrinking while wafer size is increasing. Economics is driving the industry to decrease the time for achieving high-yield, high-value production. Thus, minimizing the total time from detecting a yield problem to fixing it determines the return-on-investment for the semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Critical dimension (CD) measurement is part of process characterization of a semiconductor manufacturing flow. The uniformity of the critical dimension can be important to the photolithography team and the device engineering team. It is the design to silicon transfer of the critical dimension that can provide the chip performance in accordance to the specifications. However, determining a list of sites where the critical dimension will be measured can be challenging.

Critical dimension uniformity is generally inspected from the device perspective. There are certain devices within a chip that rely heavily on the uniformity of critical dimension to provide optimal performance. Therefore, the uniformity of critical dimension may be a more device-centric concern rather than a process-centric concern.

Design engineers, device engineers, the optical proximity correction (OPC) team, and the mask house have historically provided the list of locations for making critical dimension measurements. However, there is no methodical way to inspect all these locations or balance inspection when the various parties disagree about where critical dimension measurements should be made. Critical dimension inspection may be very time-intensive and reduces manufacturing throughput, so a semiconductor manufacturer may need to prioritize locations for inspection.

Additional inputs of critical dimension uniformity measurement sites have been critical dimension based on device importance, features that are thought to be highly process-sensitive or could be process-sensitive, optical rule check (ORC)-based hotspots from the OPC team, and mask rule check (MRC)-based hotspots from the mask house. These additional inputs still do not enable a methodical inspection technique. Output from the wafer inspection tool is not harnessed to find sites in a manner that considers design criticality and/or complexity. Even with these inputs, the sites are effectively chosen randomly.

Therefore, improved critical dimension inspection techniques and systems are needed.

BRIEF SUMMARY OF THE DISCLOSURE

In a first embodiment, a method for determining critical locations for measurement of critical dimensions is provided. An ordered location list is received at a processor. Each ordered location in the ordered location list includes a data block. Critical dimension measurements are obtained. Obtaining the critical dimension measurements comprises: (a) selecting, using the processor, one ordered location from the ordered location list to obtain a selected location; (b) measuring a first critical dimension at the selected location to obtain a first critical dimension measurement; (c) adding, using the processor, the first critical dimension measurement to the data block of the selected location; and (d) repeating steps (a) to (c) for each of the ordered locations remaining in the ordered location list.

Determining the ordered location list can include receiving, at the processor, a first set of locations related to lithography and a second set of locations related to design of a device. Each location in the first set of locations has a first order of criticality. Each location in the second set of locations has a second order of criticality. A third set of locations can be determined from results of a wafer inspection tool using the processor. Each location in the third set of locations has a third order of criticality. The first set of locations, the second set of locations, and the third set of locations can be combined using the processor into an unordered location list. Locations from the first set of location, the second set of locations, and the third set of locations in the unordered location list can be sorted using the processor based on the first order of criticality, the second order of criticality, and the third order of criticality to create the ordered location list.

Determining the third set of locations can include performing a hot scan with the wafer inspection tool to obtain one or more defects. The one or more defects can be grouped into one or more inspection groups based on design similarities. One or more design clips can be obtained. Each of the one or more design clips corresponds to one of the one or more inspection groups. An order of criticality can be calculated for each of the one or more design clips. Each order of criticality corresponds to one of the one or more inspection groups. The one or more inspection groups can be ordered based on their respective orders of criticality to create the third set of locations with the third order of criticality.

The data block can include at least one of a coordinate, a pattern criticality, a critical dimension variation, a design, a rank, and an ordered criticality.

A critical dimension location prediction model can be trained using the data block with the first critical dimension. The critical dimension location prediction model may be a deep learning network, such as a neural network.

In an instance, a synthetic location list can be created. One or more synthetic locations can be determined using the critical dimension location prediction model. The synthetic location list including the one or more synthetic locations can be created. Each of the synthetic locations has a synthetic location data block. The synthetic location data block is configured to contain synthetic location data.

Collecting the synthetic location data can include: (a) selecting one of the synthetic locations from the synthetic location list to obtain a selected synthetic location; (b) measuring a second critical dimension at the selected synthetic location to obtain a second critical dimension measurement; (c) adding the second critical dimension measurement to the synthetic location data contained in the synthetic location data block of the selected synthetic location; and (d) repeating steps (a) to (c) for each of the synthetic locations remaining in the synthetic location list.

The critical dimension location prediction model can be trained using the synthetic location data block with the second critical dimension measurement.

In an instance, a computer program product comprises a non-transitory computer readable storage medium having computer readable program embodied therewith. The computer readable program can be configured to carry out the method of any technique of the first embodiment.

In a second embodiment, a system for determining critical sites for measurement of critical dimensions is disclosed. The system includes a processor including a data collection module. The processor is configured to: (a) receive an ordered location list, wherein each ordered location in the ordered location list further comprises a data block; (b) select one ordered location from the ordered location list to obtain a selected location; (c) measure a first critical dimension at the selected location to obtain a first critical dimension measurement; (d) add the first critical dimension measurement to the data contained in the data block of the selected location; and (e) repeat actions (b) to (d) for each of the ordered locations remaining in the ordered location list. The data block is configured to contain data. An electronic data storage unit in electronic communication with the data collection module is configured to store the ordered location list.

A critical dimension measurement system can be in electronic communication with the processor.

A deep learning network for a critical dimension location prediction model may be in electronic communication with the data collection module. The critical dimension location prediction model is trained using the data blocks with the first critical dimension measurement. The deep learning network may be a neural network.

The processor can include a synthetic data module configured to determine one or more synthetic locations using the critical dimension location prediction model and create the synthetic location list including the one or more synthetic locations. Each of the synthetic locations can have a synthetic location data block. The synthetic location data block can be configured to contain synthetic location data.

The processor can include a synthetic location data collection module. The synthetic data collection module can be configured to: (a) select one of the synthetic locations from the synthetic location list to obtain a selected synthetic location; (b) measure a second critical dimension at the selected synthetic location to obtain a second critical dimension measurement; (c) add the second critical dimension measurement to the synthetic location data contained in the synthetic location data block of the selected synthetic location; and (d) repeat steps (a) to (c) for each of the synthetic locations remaining in the synthetic location list.

The critical dimension location prediction model may be trained using the synthetic location data blocks with the second critical dimension measurement.

The processor can include an ordered location list module. The ordered location list module can be configured to receive a first set of locations related to lithography and a second set of locations related to design of a device. Each location in the first set of locations has a first order of criticality. Each location in the second set of locations has a second order of criticality. A third set of locations can be determined from results of a wafer inspection tool. Each location in the third set of locations has a third order of criticality. The first set of locations, the second set of locations, and the third set of locations can be combined into an unordered location list. Locations from the first set of location, the second set of locations, and the third set of locations in the unordered location list can be sorted based on the first order of criticality, the second order of criticality, and the third order of criticality to create the ordered location list.

In an instance, the processor is further configured to receive one or more defects resulting from a hot scan. One or more defects can be grouped into one or more inspection groups based on design similarities. One or more design clips can be received. Each of the design clips corresponds to one of the one or more inspection groups. An order of criticality can be calculated for each of the one or more design clips. Each corresponds to one of the one or more inspection groups. The one or more inspection groups can be ordered based on their respective orders of criticality to create the third set of locations with the third order of criticality.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments of the present disclosure determine locations for critical dimension measurement or inspection. Inputs for a critical dimension location selection process can come from prior knowledge and a random selection of locations reported by various inspection or metrology tools. Embodiments in this disclosure can define a methodic way of ascertaining locations for measuring critical dimensions, such as on modulated, uniform, or other patterned semiconductor wafers. Thus, these techniques are applicable to process window qualification (PWQ) or process monitoring.

Many factors can impact the critical dimension of a design feature. These factors can include patterning steps including source mask optimization (SMO), OPC, assist features, and resolution enhancement techniques (RET). These factors also can include resist behavior, etch mechanisms, and chemical mechanical planarization (CMP). Such factors can be accounted for in the embodiments disclosed herein. These techniques can compensate for variation in critical dimension. Critical dimension uniformity measurement is a tool that can facilitate these techniques.

Since these mechanisms can be impacted by design density (e.g., polygon-polygon interactions), criticality information (e.g., design complexity) can be used efficiently and effectively in selecting sites that may exhibit variation in critical dimension uniformity. This can produce a subset of patterns that are a good representation of the variations in the complete die or wafer. This also can produce a subset of patterns that are unlikely to result in critical dimension problems, which can be ignored.

Embodiments of the present disclosure can provide real-time selection of locations to take critical dimension measurements based on potential impact of critical dimension variations at the locations rather than relying solely on prior knowledge. Embodiments of the present disclosure can consider the design to predict locations that may be impacted by critical dimension variations and assign an order of criticality.

Figure 1:
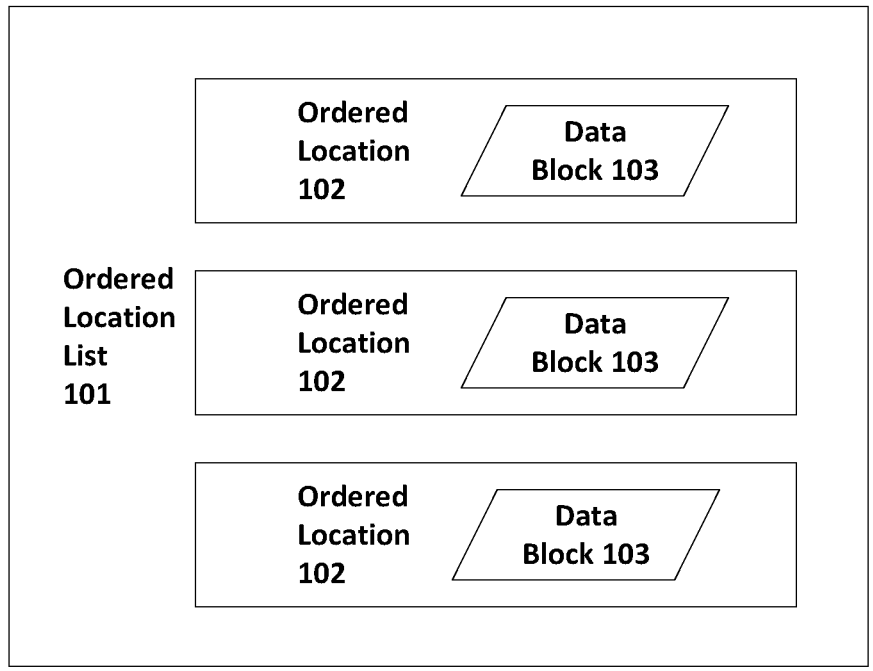
FIG. 1 shows an ordered location data block in accordance with an embodiment of the present disclosure.

With reference to FIG. 1, an ordered location list 101 can include one or more ordered locations 102. Each ordered location 102 can include a data block 103. In the example of FIG. 1, three ordered locations 102 and three data blocks 103 are illustrated, but more or fewer ordered locations 102 or data blocks 103 are possible. The ordered location list 101 may be stored on an electronic data storage unit.

The data blocks 103 are configured to hold data that corresponds to the respective ordered location 102, such as one or more of a coordinate, pattern criticality, critical dimension variation, a design, a rank, and an ordered criticality. Other data related to the ordered locations 102 can be stored in the data blocks 103.

Figure 2:
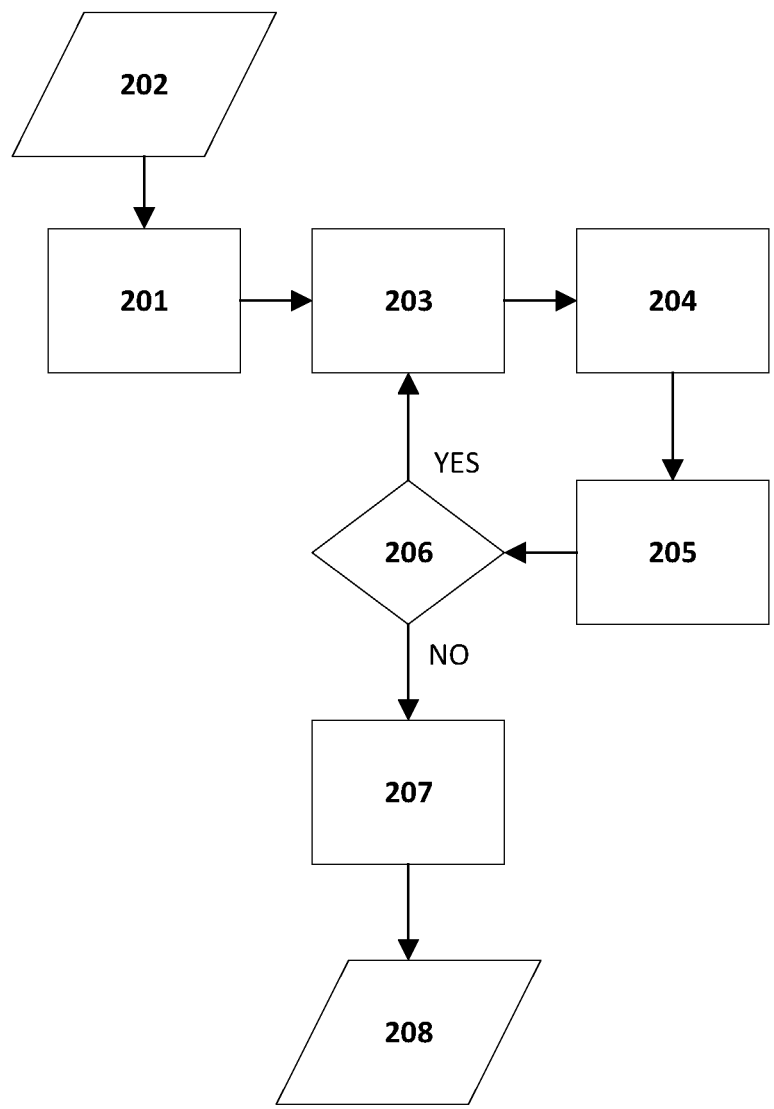
FIG. 2 is a flowchart of a method for determining critical locations for measurement of critical dimensions in accordance with an embodiment of the present disclosure.

FIG. 2 shows an embodiment where critical sites for measurement of critical dimensions are determined. First, in step 201 an ordered location list 202 is received. The ordered location list 202, which may be the ordered location list 101 of FIG. 1, includes a list of one or more ordered locations. Each ordered location has a data block configured to hold data that corresponds to that ordered location. This ordered location list 202 can serve as instructions as to which locations on the wafer may be inspected during critical dimension measurements.

The inspection involves collecting data by selecting one ordered location from the ordered location list to obtain a selected location at 203. These locations may be selected based on a semiconductor manufacturer's patterning or device failure experience. For example, a lithography team, a device team, or a wafer inspection tool (e.g., a broad band plasma (BBP) tool) may provide the first ordered location at 203. A first critical dimension can be measured at the selected location to obtain a first critical dimension at 204, such as using an SEM or optical critical dimension tool. The first critical dimension measurement can be added to the data contained in the data block of the selected location at 205. These steps can be repeated for some or all remaining ordered location in the ordered location list at 206. A test for whether the inspection cycle should exit 206 is whether there are any ordered locations on the ordered location list that have not been used yet to obtain a critical dimension measurement. If there are ordered locations on the ordered location list that have not yet been used to obtain a critical dimension measurement, then steps 203-205 repeat. In another instance, only some of the ordered locations are used to obtain a critical dimension measurement.

The ordered location list, and by extension the data contained in the data blocks for each ordered location, can be used at 207 to train a critical dimension location prediction model 208. The critical dimension location prediction model 208 can be elastic, meaning it can be retrained or refined with additional data. Once partially or fully trained, the critical dimension location prediction model 208 can be stored for future use.

In an instance, the critical dimension location prediction model 208 can be a neural network or a deep learning network.

The critical dimension location prediction model 208 can be used to determine at which locations critical dimension measurements should occur. The locations may be selected based on design criticality and, consequently, can vary from wafer to wafer based on design variation. The critical dimension location prediction model 208 may optimize where critical dimension measurements are taken to improve inspection efficiency.

Figure 3:
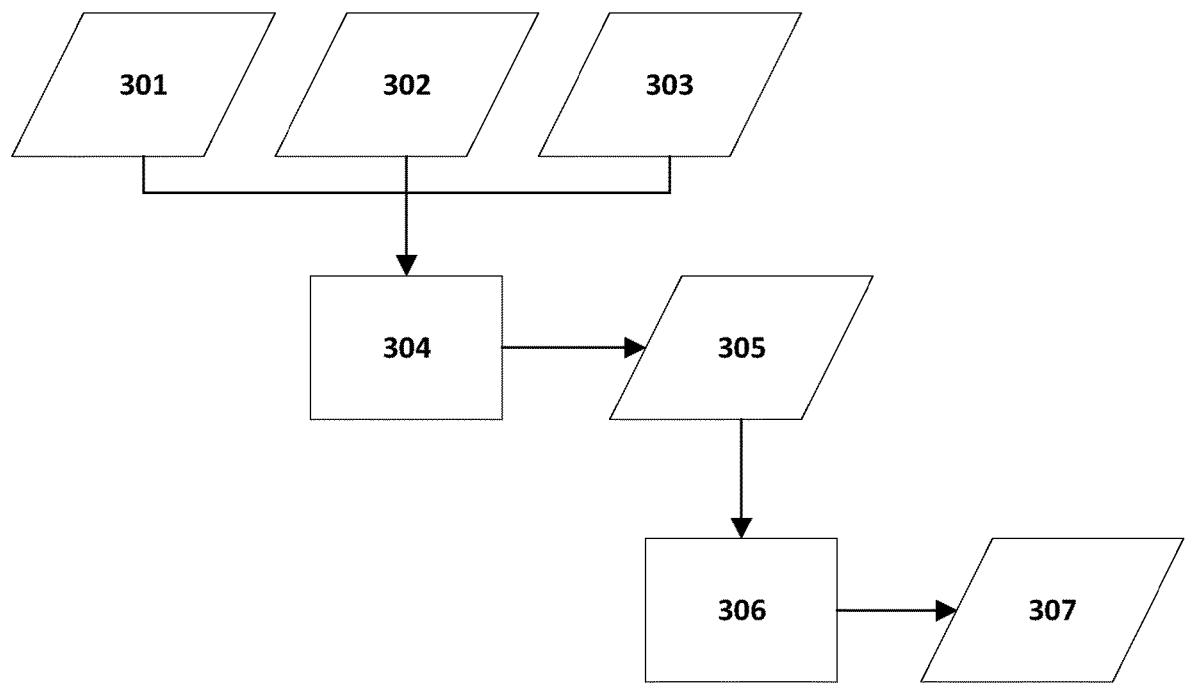
FIG. 3 is a flowchart of a method of determining an ordered location list in accordance with an embodiment of the present disclosure.

In another embodiment, with reference to FIG. 3, an ordered location list is determined for use in measuring critical dimensions. This determination involves receiving a first set of locations 301 related to lithography (e.g., locations from a lithography team), a second set of locations 302 related to design of a device (e.g., locations from a device team), and determining a third set of locations 303 from a wafer inspection tool. While these three sets of locations are disclosed at 301, 302, and 303, in other instances only one or two of the sets of locations may be used. In another instance, more than three sets of locations may be used. The number of sets of locations may depend on how many zones criticality is divided into.

Each of the locations in the sets of locations 301, 302, and 303 has an order of criticality. This order of criticality may be determined or otherwise evaluated using a design criticality algorithm. The sets of locations 301, 302, and 303 are then combined in step 304, yielding an unordered location list 305. The unordered location list 305 is sorted in a sorting step 306 to yield an ordered location list 307.

The sorting is done by order of criticality, and the ordered locations in the ordered location list 307 are ranked by their corresponding orders of criticality. Thus, the sets of locations 301, 302, and 303 are sorted using the first order of criticality, second order of criticality, and third order of criticality to form the ordered location list. Criticality can be measured by running an algorithm like shape based grouping (SBG) on the design file or on the design clips obtained from a wafer inspection tool after a design grouping (DBG) function, such as using design based grouping.

The ordered location list 307 may be the ordered location list 202 received at 201 in FIG. 2.

Figure 4:
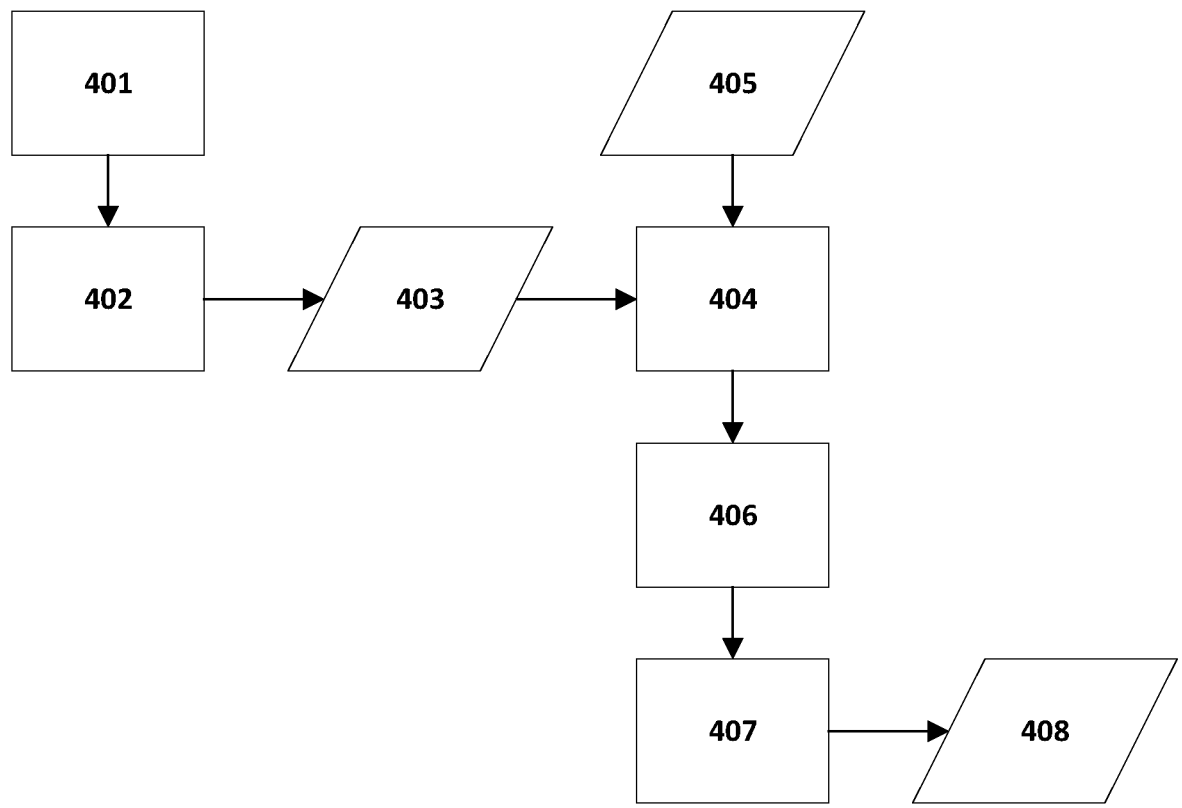
FIG. 4 is a flowchart of a method of determining a set of inspector locations in accordance with an embodiment of the present disclosure.

In another embodiment, with reference to FIG. 4, a set of inspector locations is determined. A hot scan 401 of one or more inspection sites is performed to obtain one or more defects. For example, a BBP tool may be used to perform the hot scan. The defects are then grouped at 402 based on design similarities into one or more inspection groups 403. One or more design clips 405 are obtained. The inspection groups 403 are then combined 404 with corresponding design clips 405. In 406, each design clip 405 corresponding to an inspection group 403 is used to calculate an order of criticality for the inspection group 403. For example, shape based grouping or FLEX rules may be used on a design file to determine criticality. The inspection groups 403 are then ordered in step 407 based on their orders of criticality to create the set of inspector locations 408.

A hot scan is one where the detection threshold (e.g., the minimum difference in die-to-die gray level) to determine whether a pixel is defective is set to a low value. Thus, such a detection recipe would find a large number of "defects." The threshold can be tuned to catch only the real defects and filter out false detections such as noise or nuisance defects.

The set of inspector locations 408 may be the third set of locations 303 in FIG. 3.

Figure 5:
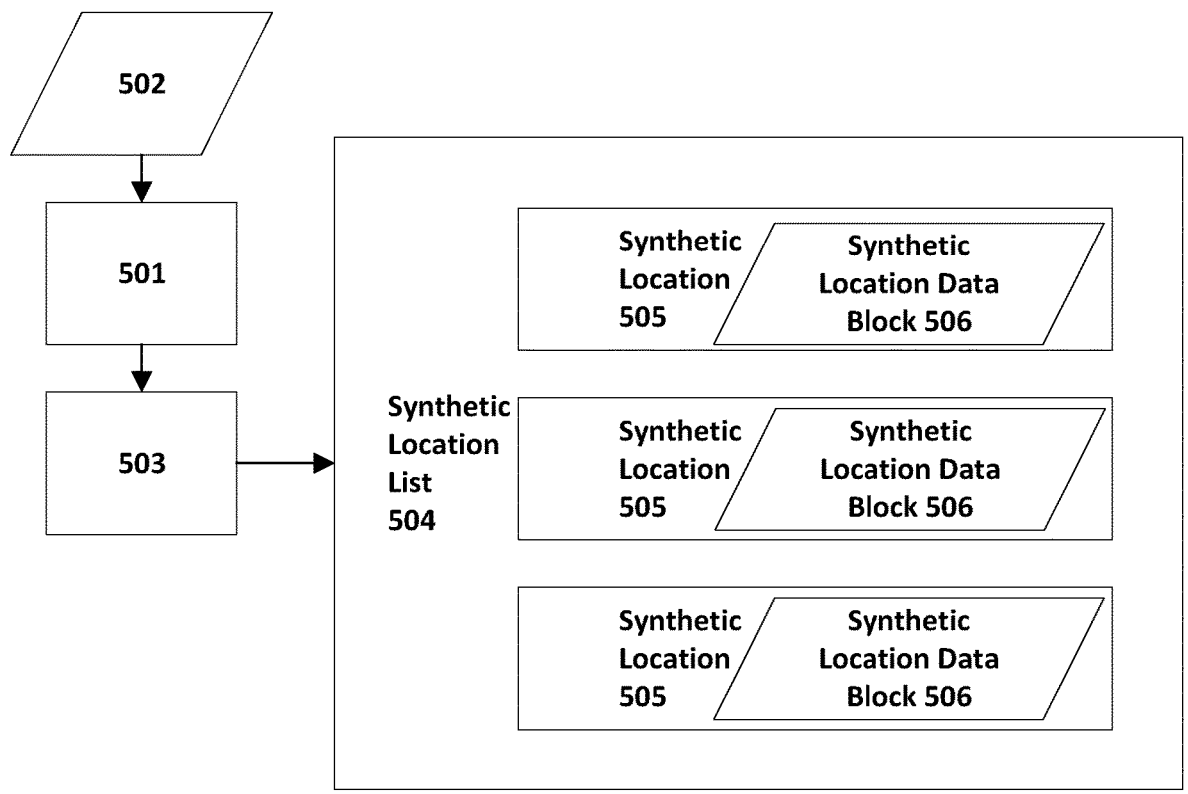
FIG. 5 is a flowchart of a method of creating a synthetic location list in accordance with an embodiment of the present disclosure.

In another embodiment, with reference to FIG. 5, a synthetic location list is created. The critical dimension location prediction model 502 is used as input in step 501, where one or more synthetic locations are determined. These synthetic locations are used at 503 to form a synthetic location list 504. The synthetic location list 504 includes one or more synthetic locations 505, each further comprising a synthetic location data block 506.

In the example of FIG. 5, three synthetic locations 505 and three synthetic location data blocks 506 are illustrated, but more or fewer synthetic locations 505 or synthetic location data blocks 506 are possible. The synthetic location list 504 may be stored on an electronic data storage unit.

The synthetic location data blocks 506 are configured to hold synthetic location data that corresponds to the respective synthetic locations 505, such as one or more of a coordinate, pattern criticality, critical dimension variation, a design, a rank, and an ordered criticality. Other data related to the ordered synthetic locations 505 can be stored in the location data blocks 506.

Figure 6:
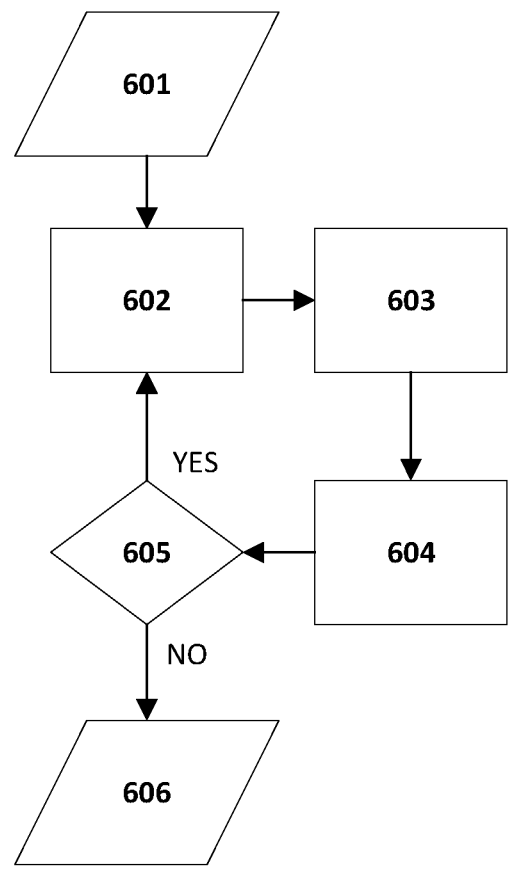
FIG. 6 is a flowchart of a method of collecting synthetic location data in accordance with an embodiment of the present disclosure.

Synthetic data can be used to train a machine learning model so that the machine learning model can predict future sites for critical dimension uniformity measurements. In another embodiment, with reference to FIG. 6, synthetic location data is collected using inspection based on a synthetic location list. This inspection involves collecting data by selecting one synthetic location from the synthetic location list 601 to obtain a selected synthetic location at 602. The synthetic location may be selected based on input from a semiconductor manufacturer or based on a complexity prediction algorithm like shape based grouping. A second critical dimension is measured at the selected synthetic location to obtain a second critical dimension at 603. The second critical dimension measurement is added to the synthetic location data contained in the synthetic location data block of the selected synthetic location at 604. These steps 602-604 are repeated for some or all remaining synthetic locations in the synthetic location list at 605. A test for whether the inspection cycle should exit 606 is whether there are any synthetic locations on the synthetic location list that have not been used yet to obtain a synthetic dimension measurement. If there are synthetic locations on the synthetic location list that have not yet been used to obtain a synthetic dimension measurement, then steps 602-604 repeat. In another instance, only some of the synthetic locations are used to obtain a critical dimension measurement.

Synthetic data may initially come from a semiconductor wafer. Using one of the techniques herein, locations to measure critical dimension can be obtained and measured using SEM and critical dimension algorithms. The generated data also can be the synthetic data.

The synthetic location list 601 may be the synthetic location list 504 of FIG. 5.

In an embodiment, the synthetic location list 601 can be used to train a critical dimension location prediction model using the synthetic location data contained in one or more of the synthetic location data blocks. Design may vary between wafers, so the predictions may be used for wafers or dies with similar designs. However, the predictions also can be used for different designs on different wafers or different dies.

The embodiments of the present disclosure provide several advantages. Beyond using only prior process and device knowledge, it can provide critical dimension measurement locations based on feedback from a wafer inspection tool and order of design criticality. The inputs can be considered alone or in combination. The ranking of an ordered location list based on orders of criticality can enable the filtering of locations based on criticality and complexity.

Embodiments of the methods illustrated in FIGS. 2-6 can be run in real-time. This can reduce the impact on manufacturing throughput. Furthermore, the methods illustrated in FIGS. 2-6 reduce dependence on subjective user inputs.

Figure 7:
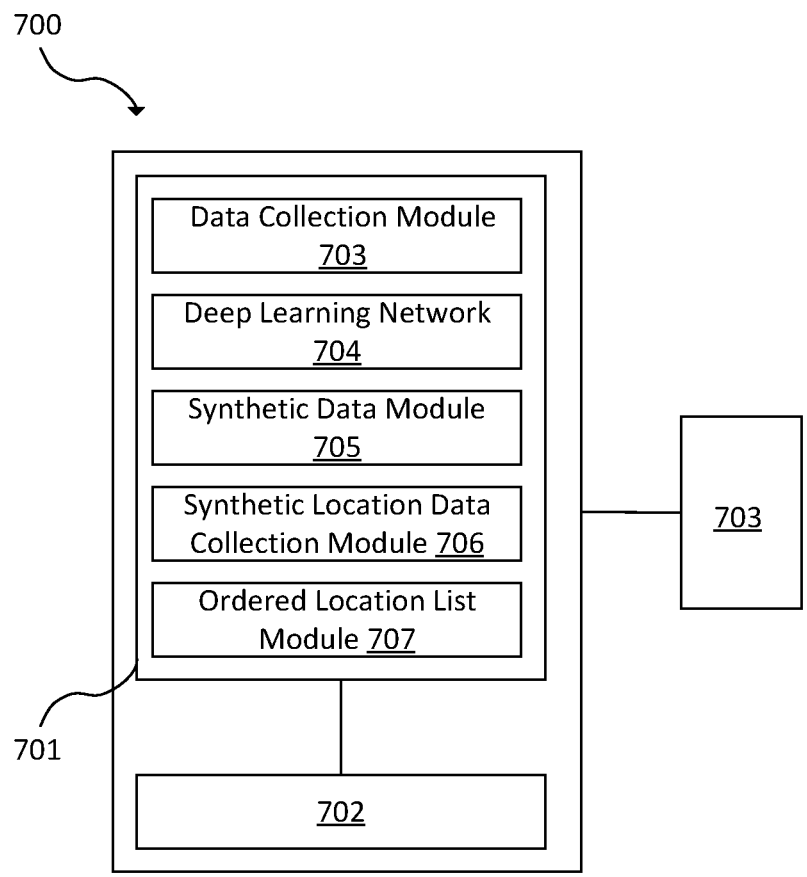
FIG. 7 is a block diagram of an embodiment of a system in accordance with the presentation disclosure.

FIG. 7 is a block diagram of a system embodiment that can be used to determine critical sites for measuring critical dimension. The system 700 includes a processor 701 and an electronic data storage unit 702 in electronic communication with the processor 701. Both the processor 701 and the electronic data storage unit 702 are in electronic communication with the critical dimension measurement system 703, such as an SEM. The critical dimension measurement system 703 may include a stage configured to hold a wafer and an imaging system, which may use an electron or optical beam, to image a surface of the wafer. The processor 701 may include a microprocessor, a microcontroller, or other devices. A critical dimension measurement system 703 can receive instructions or other information from the processor 701. The processor 701 and/or the electronic data storage unit 702 optionally may be in electronic communication with a wafer inspection tool, wafer metrology tool, or wafer review tool (not illustrated) to receive additional information or send instructions.

The processor 701 and electronic data storage unit 702 may be part of the critical dimension measurement system 703 or another device. In an example, the processor 701 and electronic data storage unit 702 may be part of a standalone control unit or in a centralized quality control unit. Multiple processors 701 or electronic data storage unit 702 may be used.

The processor 701 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 701 to implement various methods and functions may be stored in readable storage media, such as a memory in the electronic data storage unit 702 or other memory.

The processor 701 may be coupled to the components of the system 700 in any suitable manner (e.g., via one or more transmission media, which may include wired and/or wireless transmission media) such that the processor 701 can receive output. The processor 701 may be configured to perform a number of functions using the output.

The processor 701, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

An additional embodiment relates to a non-transitory computer-readable medium storing program instructions executable on a processor for performing defect detection, as disclosed herein. In particular, the processor 701 can be coupled to a memory in the electronic data storage unit 702 or other electronic data storage medium with non-transitory computer-readable medium that includes program instructions executable on the processor 701. The computer-implemented method may include any step(s) of any method(s) described herein. For example, the processor 701 may be programmed to perform some or all of the steps of any of FIGS. 2-6 or other embodiments disclosed herein.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

The processor 701 can include a data collection module 703. The data collection module can be configured to (a) receive an ordered location list; (b) select one ordered location from the ordered location list to obtain a selected location; (c) measure a first critical dimension at the selected location to obtain a first critical dimension measurement; (d) add the first critical dimension measurement to the data contained in the data block of the selected location; and (e) repeat actions (b) to (d) for each of the ordered locations remaining in the ordered location list. Each ordered location in the ordered location list can further include a data block that is configured to contain data. The electronic data storage unit 702 may be in electronic communication with the data collection module 703. The electronic data storage unit 702 can be configured to store the ordered location list.

The processor 701 also can include a deep learning network 704 that contains or can use a critical dimension location prediction model. The deep learning network 704 can be in electronic communication with the data collection module 703. The critical dimension location prediction model can be trained using the data blocks with the first critical dimension measurement. The deep learning network 704 may be a neural network.

The processor 701 also can include a synthetic data module 705 that is configured to determine one or more synthetic locations using the critical dimension location prediction model used by the deep learning network 704 and create the synthetic location list including the one or more synthetic locations. Each of the synthetic locations has a synthetic location data block. The synthetic location data block is configured to contain synthetic location data.

The processor 701 also can include a synthetic location data collection module 706 that is configured to (a) select one of the synthetic locations from the synthetic location list to obtain a selected synthetic location; (b) measure a second critical dimension at the selected synthetic location to obtain a second critical dimension measurement; and (c) add the second critical dimension measurement to the synthetic location data contained in the synthetic location data block of the selected synthetic location. The synthetic location data collection module 706 can repeat steps (a) to (c) for each of the synthetic locations remaining in the synthetic location list.

The critical dimension location prediction model used by the deep learning network 704 can be trained using the synthetic location data blocks with the second critical dimension measurement.

The processor 701 can further include an ordered location list module 707. The ordered location list module 707 can be configured to: receive a first set of locations related to lithography, a second set of locations related to design of a device, and determine a third set of locations from results of a wafer inspection tool. Each location in the first set of locations can have a first order of criticality. Each location in the second set of locations can have a second order of criticality. Each location in the third set of locations can have a third order of criticality. The ordered location list module 707 can combine the first set of locations, the second set of locations, and the third set of locations into an unordered location list. The ordered location list module 707 also can sort locations from the first set of location, the second set of locations, and the third set of locations in the unordered location list based on the first order of criticality, the second order of criticality, and the third order of criticality to create the ordered location list.

The processor 701 can be further configured to receive one or more defects resulting from a hot scan; group the one or more defects into one or more inspection groups based on design similarities; receive one or more design clips, each corresponding to one of the one or more inspection groups; calculate an order of criticality for each of the one or more design clips, each corresponding to one of the one or more inspection groups; and order the one or more inspection groups based on their respective orders of criticality to create the third set of locations with the third order of criticality. A BBP tool may be used to generate the defects using the hot scan.

While illustrated as part of the processor 701, the data collection module 703, deep learning network 704, synthetic data module 705, synthetic location data collection module 706, and/or ordered location list module 707 can be separate from the processor 701. For example one or more of these modules may be a standalone system or can be part of a different processor.

The present disclosure may be embodied to use neural networks as a deep learning network 704. In some embodiments, a neural network is a generative model. A generative model can be generally defined as a model that is probabilistic in nature. In other words, a generative model is not one that performs forward simulation or rule-based approaches. Instead, the generative model can be learned (in that its parameters can be learned) based on a suitable training set of data.

In an embodiment, a neural network is configured as a deep generative model. For example, the model may be configured to have a deep learning architecture in that the model may include multiple layers, which perform a number of algorithms or transformations. The number of layers on one or both sides of the model may vary. For example, the number of layers on the encoder side of the generative model is use case dependent. In addition, the number of layers on the decoder side is use case dependent and may be dependent on the number of layers on the encoder side. In general, the number of layers on one or both sides of the generative model is not significant and is use case dependent. For practical purposes, a suitable range of layers on both sides is from two layers to a few tens of layers.

In another embodiment, a neural network may be a deep learning neural network with a set of weights that model the world according to the data that it has been fed to train it. Neural networks can be generally defined as a computational approach which is based on a relatively large collection of neural units loosely modeling the way a biological brain solves problems with relatively large clusters of biological neurons connected by axons. Each neural unit is connected with many others, and links can be enforcing or inhibitory in their effect on the activation state of connected neural units. These systems are self-learning and trained rather than explicitly programmed and can excel in areas where the solution or feature detection is difficult to express in a traditional computer program. Deep learning is a probabilistic graph model with multiple neuron layers, commonly known as a deep architecture. Deep learning technology processes the information such as image, text, voice, or other inputs in a hierarchical manner. In using deep learning in the present disclosure, feature extraction is accomplished automatically using learning from data. This is advantageous over previous approaches which extract features based on experts' understanding of a set of images. In this disclosure, predict near-optimal values of fixed parameters are predicted by the neural network given reference values of critical parameters.

Neural networks typically consist of multiple layers, and the signal path traverses from front to back. The goal of the neural network is to solve problems in the same way that the human brain would, although several neural networks are much more abstract. Neural network projects typically work with a few thousand to a few million neural units and millions of connections. The neural network may have any suitable architecture and/or configuration known in the art.

There are many variants of neural networks with deep architecture depending on the probability specification and network architecture, including, but not limited to, a Deep Belief Network (DBN), a Restricted Boltzmann Machine (RBM), an Auto-Encoder, or a convolutional neural network (CNN). The actual implementation may vary depending on the information available, size of the information provided, and the nature of the problem.

Program instructions implementing methods such as those described herein may be stored on computer-readable medium, such as in the electronic data storage unit 702 or other storage medium. The computer-readable medium may be a storage medium such as a magnetic or optical disk, a magnetic tape, or any other suitable non-transitory computer-readable medium known in the art. For example, the memory in the electronic data storage unit 702 or other electronic data storage medium may be a storage medium such as a magnetic or optical disk, a magnetic tape, or any other suitable non-transitory computer-readable medium known in the art. In particular, the electronic data storage unit 702 can include persistent storage, random access memory, or a split database.

In an instance, the non-transitory computer-readable storage medium comprises one or more programs for executing steps on one or more computing devices. The steps on the non-transitory computer-readable storage medium can include determining critical locations for measurement of critical dimensions. The steps on the non-transitory computer-readable storage medium also can include some or all of the steps of any one of FIGS. 2-6 or other embodiments disclosed herein.

The term "critical dimension" can include any critical dimension of a structure (e.g., bottom critical dimension, middle critical dimension, top critical dimension, sidewall angle, grating height, etc.), a critical dimension between any two or more structures (e.g., distance between two structures), or a displacement between two or more structures (e.g., overlay displacement between overlaying grating structures, etc.). Structures may include three dimensional structures, patterned structures, overlay structures, etc.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method for determining critical locations for measurement of critical dimensions comprising:
   receiving, at a processor, an ordered location list, wherein each ordered location in the ordered location list includes a data block; and
   obtaining critical dimension measurements, comprising:
   (a) selecting, using the processor, one ordered location from the ordered location list to obtain a selected location;
   (b) measuring a first critical dimension at the selected location to obtain a first critical dimension measurement;
   (c) adding, using the processor, the first critical dimension measurement to the data block of the selected location; and
   (d) repeating steps (a) to (c) for each of the ordered locations remaining in the ordered location list;
   training a critical dimension location prediction model using the data block with the first critical dimension; and
   creating a synthetic location list, comprising:
   determining one or more synthetic locations using the critical dimension location prediction model; and creating the synthetic location list including the one or more synthetic locations, each of the synthetic locations having a synthetic location data block, wherein the synthetic location data block is configured to contain synthetic location data.

2. The method of claim 1, wherein determining the ordered location list includes:
receiving, at the processor, a first set of locations related to lithography, each location in the first set of locations having a first order of criticality;
receiving, at the processor, a second set of locations related to design of a device, each location in the second set of locations having a second order of criticality;
determining, using the processor, a third set of locations from results of a wafer inspection tool, each location in the third set of locations having a third order of criticality;
combining, using the processor, the first set of locations, the second set of locations, and the third set of locations into an unordered location list; and
sorting, using the processor, locations from the first set of location, the second set of locations, and the third set of locations in the unordered location list based on the first order of criticality, the second order of criticality, and the third order of criticality to create the ordered location list.

3. The method of claim 2, wherein determining the third set of locations includes:
performing a hot scan with the wafer inspection tool to obtain one or more defects;
grouping the one or more defects into one or more inspection groups based on design similarities;
obtaining one or more design clips, each of the one or more design clips corresponding to one of the one or more inspection groups;
calculating an order of criticality for each of the one or more design clips, each corresponding to one of the one or more inspection groups; and
ordering the one or more inspection groups based on their respective orders of criticality to create the third set of locations with the third order of criticality.

4. The method of claim 1, wherein the data block includes at least one of a coordinate, a pattern criticality, a critical dimension variation, a design, a rank, and an ordered criticality.

5. The method of claim 1, wherein the critical dimension location prediction model is a deep learning network.

6. The method of claim 5, wherein the deep learning network is a neural network.

7. The method of claim 1, further comprising collecting the synthetic location data, comprising:
(e) selecting one of the synthetic locations from the synthetic location list to obtain a selected synthetic location;
(f) measuring a second critical dimension at the selected synthetic location to obtain a second critical dimension measurement;
(g) adding the second critical dimension measurement to the synthetic location data contained in the synthetic location data block of the selected synthetic location; and
(h) repeating steps (e) to (g) for each of the synthetic locations remaining in the synthetic location list.

8. The method of claim 7, further comprising training the critical dimension location prediction model using the synthetic location data block with the second critical dimension measurement.

9. A computer program product comprising a non-transitory computer readable storage medium having a computer readable program embodied therewith, the computer readable program configured to carry out the method of claim 1.

10. A system for determining critical sites for measurement of critical dimensions, comprising:
a processor including a data collection module configured to:
(a) receive an ordered location list, wherein each ordered location in the ordered location list further comprises a data block, wherein the data block is configured to contain data;
(b) select one ordered location from the ordered location list to obtain a selected location;
(c) measure a first critical dimension at the selected location to obtain a first critical dimension measurement;
(d) add the first critical dimension measurement to the data contained in the data block of the selected location; and
(e) repeat actions (b) to (d) for each of the ordered locations remaining in the ordered location list;
an electronic data storage unit in electronic communication with the data collection module that is configured to store the ordered location list; and
a deep learning network for a critical dimension location prediction model in electronic communication with the data collection module, wherein the critical dimension location prediction model is trained using the data blocks with the first critical dimension measurement;
wherein the processor further comprises a synthetic data module configured to:
determine one or more synthetic locations using the critical dimension location prediction model; and
create the synthetic location list including the one or more synthetic locations, each of the synthetic locations having a synthetic location data block, wherein the synthetic location data block is configured to contain synthetic location data.

11. The system of claim 10, further comprising a critical dimension measurement system in electronic communication with the processor.

12. The system of claim 10, wherein the deep learning network is a neural network.

13. The system of claim 10, wherein the processor further comprises a synthetic location data collection module configured to:
(f) select one of the synthetic locations from the synthetic location list to obtain a selected synthetic location;
(g) measure a second critical dimension at the selected synthetic location to obtain a second critical dimension measurement;
(h) add the second critical dimension measurement to the synthetic location data contained in the synthetic location data block of the selected synthetic location; and
(i) repeat steps (f) to (h) for each of the synthetic locations remaining in the synthetic location list.

14. The system of claim 13, wherein the critical dimension location prediction model is trained using the synthetic location data blocks with the second critical dimension measurement.

15. The system of claim 10, wherein the processor further comprises an ordered location list module configured to:

receive a first set of locations related to lithography, each location in the first set of locations having a first order of criticality;

receive a second set of locations related to design of a device, each location in the second set of locations having a second order of criticality;

determine a third set of locations from results of a wafer inspection tool, each location in the third set of locations having a third order of criticality;

combine the first set of locations, the second set of locations, and the third set of locations into an unordered location list; and sort locations from the first set of location, the second set of locations, and the third set of locations in the unordered location list based on the first order of criticality, the second order of criticality, and the third order of criticality to create the ordered location list.

16. The system of claim 15, wherein the processor is further configured to:

receive one or more defects resulting from a hot scan;

group the one or more defects into one or more inspection groups based on design similarities;

receive one or more design clips, each of the design clips corresponds to one of the one or more inspection groups;

calculate an order of criticality for each of the one or more design clips, each corresponding to one of the one or more inspection groups; and order the one or more inspection groups based on their respective orders of criticality to create the third set of locations with the third order of criticality.

* * * * *